United States Patent
Shen et al.

(10) Patent No.: US 11,767,219 B2
(45) Date of Patent: Sep. 26, 2023

(54) SEMICONDUCTOR STRUCTURE INCLUDING SCRIBE LINE STRUCTURES AND METHOD FOR FABRICATING THE SAME

(71) Applicant: TAIWAN SEMICONDUCTOR MANUFACTURING COMPANY LTD., Hsinchu (TW)

(72) Inventors: Wei-Cheng Shen, Tainan (TW); Yi-Hsien Chang, Changhua County (TW); Yi-Heng Tsai, Hsinchu (TW); Chun-Ren Cheng, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 475 days.

(21) Appl. No.: 16/932,622

(22) Filed: Jul. 17, 2020

(65) Prior Publication Data
US 2020/0346926 A1 Nov. 5, 2020

Related U.S. Application Data

(62) Division of application No. 15/168,848, filed on May 31, 2016, now Pat. No. 10,737,936.

(51) Int. Cl.
*B81C 1/00* (2006.01)

(52) U.S. Cl.
CPC ............ *B81C 1/00825* (2013.01); *B81B 2203/0323* (2013.01); *B81C 2203/0785* (2013.01)

(58) Field of Classification Search
CPC combination set(s) only.
See application file for complete search history.

(56) References Cited

U.S. PATENT DOCUMENTS

2012/0161308 A1* 6/2012 Chu ............... H01L 23/3114
257/E31.124

\* cited by examiner

*Primary Examiner* — Suberr L Chi
(74) *Attorney, Agent, or Firm* — WPAT LAW; Anthony King (57) ABSTRACT

A method of fabricating a semiconductor structure includes: providing a first wafer; providing a second wafer having a first surface and a second surface opposite to the first surface; contacting the first surface of the second wafer with the first wafer; and forming a plurality of scribe lines on the second surface of the second wafer, wherein the formation of the plurality of scribe lines includes removing portions of the second wafer from the second surface towards the first surface to form a third surface between the first surface and the second surface, and the plurality of scribe lines protrudes from the third surface of the second wafer.

20 Claims, 13 Drawing Sheets

SEMICONDUCTOR STRUCTURE INCLUDING SCRIBE LINE STRUCTURES AND METHOD FOR FABRICATING THE SAME

PRIORITY CLAIM AND CROSS-REFERENCE

This application is a divisional application of U.S. non-provisional application Ser. No. 15/168,848 filed on May 31, 2016, entitled "SEMICONDUCTOR STRUCTURE AND METHOD FOR FABRICATING THE SAME," the disclosure of which is hereby incorporated by reference in its entirety.

BACKGROUND

Semiconductor devices are used in a variety of electronic applications, such as personal computers, cell phones, and digital cameras. Semiconductor devices are typically fabricated by sequentially depositing insulating or dielectric layers, conductive layers, and semiconductor layers over a semiconductor substrate, and patterning the various layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Individual dies on a wafer may be formed using semiconductor processing techniques. After device formation, the dies may be cut from the wafer by a saw, laser or the like. The dies may be spaced apart by a dicing street, scribe line or the like to account for the width of the cutting apparatus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Micro-electro mechanical system (MEMS) devices have been developed and used in electronic equipment. In MEMS device fabrication, semiconductive materials are used to form mechanical and electrical features. A MEMS device may include a number of elements (e.g., stationary or movable elements) for achieving electro-mechanical functionality. MEMS applications include motion sensors, pressure sensors, printer nozzles, or the like. Complementary Metal-Oxide-Semiconductor (CMOS) devices may be analog circuits such as CMOS image sensors (CIS), analog to digital converters used in microprocessors, microcontrollers, Random Access Memories (RAM). A MEMS device and a CMOS device may be integrated into a die. During the fabrication process, a MEMS wafer may be bonded with a CMOS wafer before the dicing process. The MEMS-CMOS wafer may be thinned into die level when the semiconductor industry continues to reduce the feature size of a MEMS-CMOS die. Large warpage may damage or delaminate the structure in the MEMS-CMOS wafer during the transportation of the MEMS-CMOS wafer.

To solve the above mentioned problem, a scribe line structure capable of increasing a wafer tension is proposed. The scribe line structure is disposed on a surface or a side of a wafer for alleviating the warpage or deformation of the wafer during transportation. The wafer may be a MEMS wafer, a CMOS wafer, or a MEMS-CMOS wafer. For brevity, the feature of the proposed scribe line structure is carried out by a MEMS-CMOS wafer. The scribe line structure comprises a plurality of scribe lines positioned between dies of the MEMS-CMOS wafer to permit the use of a cutting apparatus to singulate the dies without cutting the dies themselves. Each scribe line has a width to accommodate the cutting apparatus and a buffer region to account for variances in cutting or the cutting apparatus.

Figure 1:
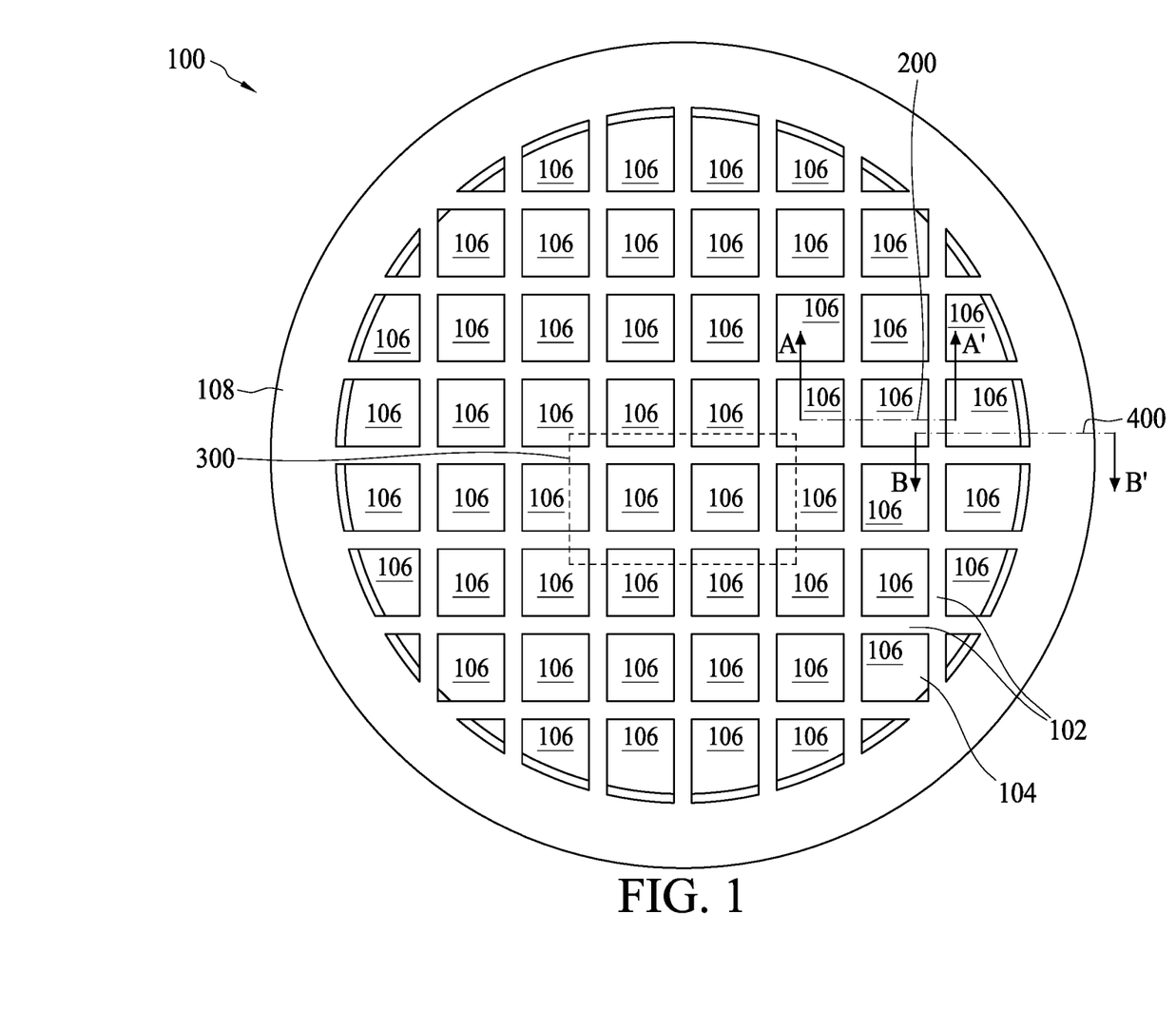
FIG. 1 is diagram illustrating a top view of a wafer level semiconductor structure with a plurality of scribe lines disposed on a surface of the wafer level semiconductor structure according to some embodiments.

FIG. 1 is diagram illustrating a top view of a wafer level semiconductor structure 100 with a plurality of scribe lines 102 disposed on a surface 104 of the semiconductor structure 100 according to some embodiments. The semiconductor structure 100 may be a MEMS-CMOS wafer. The MEMS-CMOS wafer comprises a MEMS wafer bonding with a CMOS wafer. According to some embodiments, the plurality of scribe lines 102 is disposed on a backside of the semiconductor structure 100, i.e., the surface 104 of the MEMS wafer. This is not a limitation of the embodiments. The plurality of scribe lines 102 may be disposed on a front side of the semiconductor structure 100, i.e., the surface of the CMOS wafer. The plurality of scribe lines 102 protrudes from the surface 104 of the semiconductor structure 100. The semiconductor structure 100 comprises an array of dies (or chips) 106 separated from each other by two sets of intersecting scribe lines 102. A first set of scribe lines 102 may be a plurality of straight lines extend along a first direction and a second set of scribe lines 102 may be a plurality of straight lines extend along a second direction. The first direction may be perpendicular to the second direction. However, this is not a limitation of the embodiments. The first direction and the second direction may form any angle on the intersections.

The semiconductor structure 100 is further configured to have a wafer edge line 108 on the wafer edge of the semiconductor structure 100. The wafer edge line 108 also protrudes from the surface 104 of the semiconductor structure 100. The wafer edge line 108 surrounds the plurality of scribe lines 102. According to some embodiments, each of the scribe lines 102 has one end contacting an inner point of the wafer edge line 108 and the other end contacting a corresponding inner point of the wafer edge line 108. The line width of the wafer edge line 108 is larger than the line width of a scribe line. For example, the line width of the wafer edge line 108 may be about 5 mm and the line width of a scribe line 102 may be about 60 um, as shown in FIG. 1.

According to some embodiments, the plurality of scribe lines 102 and the wafer edge line 108 have the similar height measured from the surface 104 of the semiconductor structure 100. In other words, the plurality of scribe lines 102 and the wafer edge line 108 have the similar top level. The plurality of scribe lines 102 and the wafer edge line 108 are arranged to protrude from the surface 104 of the semiconductor structure 100 to increase the effective thickness of the semiconductor structure 100 before being diced. When the effective thickness of the semiconductor structure 100 increases, the wafer tension of the semiconductor structure 100 also increases. Accordingly, the warpage or deformation of the semiconductor structure 100 can be alleviated when the handling system handles the semiconductor structure 100 during transportation.

Figure 2:
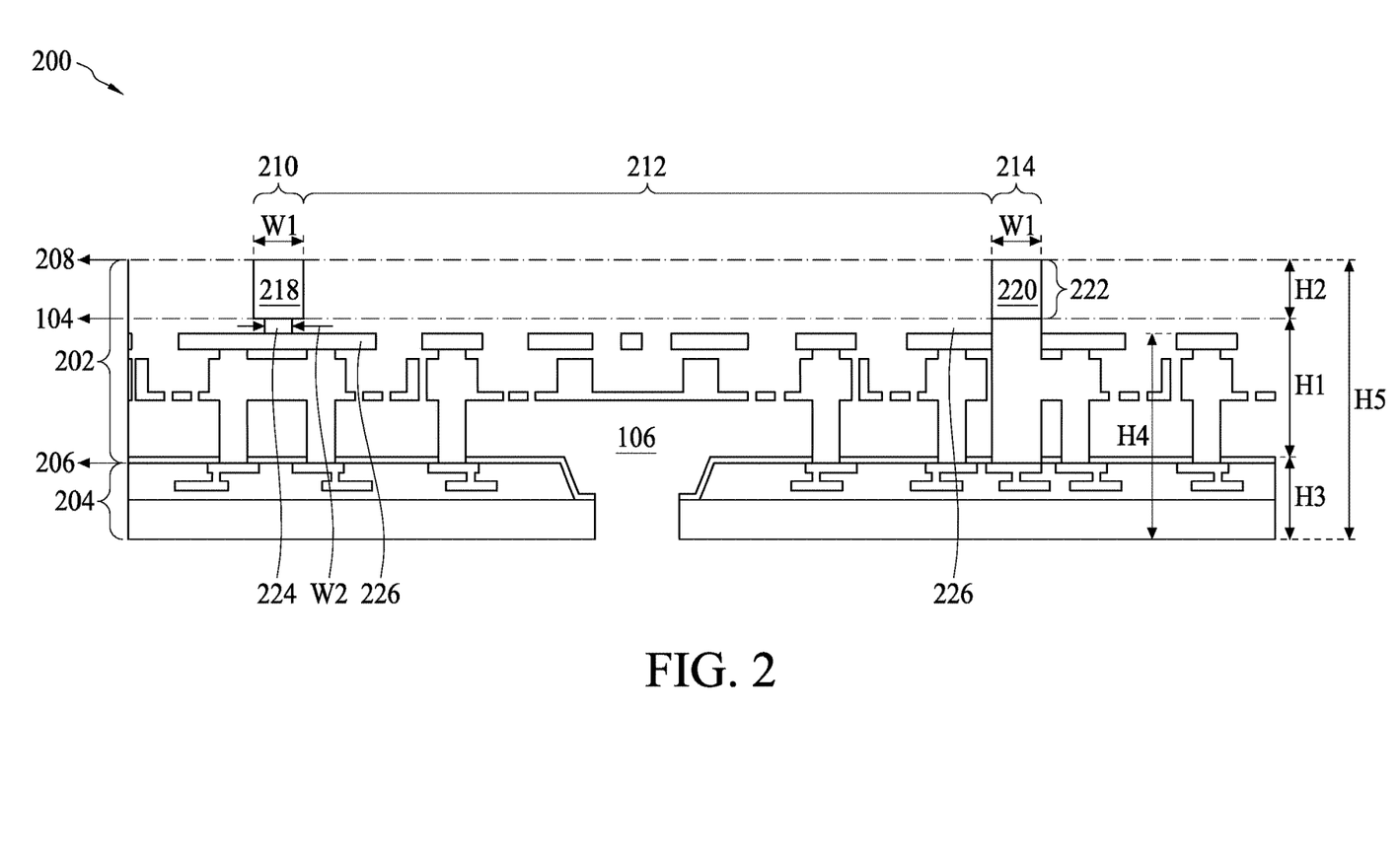
FIG. 2 is a diagram illustrating a cross-sectional view of a portion of the wafer level semiconductor structure taken along the line A-A' shown in FIG. 1 according to some embodiments.

The scribe lines 102 may have different contact areas to contact the surface 104 at the bottom sides. FIG. 2 is a diagram illustrating a cross-sectional view of a portion 200 of the semiconductor structure 100 taken along the line A-A' shown in FIG. 1 according to some embodiments. FIG. 2 merely shows a portion 200 of the semiconductor structure 100, and this is not a limitation of the present disclosure.

The semiconductor structure 100 comprises two wafers, in which a first wafer is a MEMS wafer 202 and a second wafer is a CMOS wafer 204. The MEMS wafer 202 is configured to form a structure corresponding to an electromechanical function. The CMOS wafer 204 is configured to form an integrated circuit, such as an application-specific integrated circuit (ASIC). The MEMS wafer 202 has a first surface 206 bonding to a predetermined bonding area of the CMOS wafer 204 such that the MEMS structures of the array of dies 106 on the MEMS wafer 202 are aligned to the integrated circuits of the array of dies 106 on the CMOS wafer 204. The MEMS wafer 202 has a second surface 208 being the top surface of the semiconductor structure 100. The level of the surface 104 is sandwiched between the levels of the surface 206 and the surface 208.

According to some embodiments, the portion 200 at least comprises three regions, in which the first region is a first scribe line region 210, the second region is a die region 212, and the third region is a second scribe line region 214. The die region 212 is disposed between the first scribe line region 210 and the second scribe line region 214. For illustration purpose, the structure of the first scribe line region 210 is different from the structure of the second scribe line region 214. However, this is not a limitation of the present disclosure. All of the scribe lines 102 of the semiconductor structure 100 may be arranged to have the structure similar to the structure of the first scribe line region 210, or all of the scribe lines 102 of the semiconductor structure 100 may be arranged to have the structure similar to the structure of the second scribe line region 214, or some of the scribe lines 102 of the semiconductor structure 100 are arranged to have the structure similar to the structure of the first scribe line region 210 and the other scribe lines 102 of the semiconductor structure 100 are arranged to have the structure similar to the structure of the second scribe line region 214.

According to the portion 200 as shown in FIG. 2, a die 106 is formed in the die region 212. The first scribe line region 210 and the second scribe line region 214 are to be cut by a cutting tool to singulate the die 106. The first scribe line region 210 is arranged to form a first scribe line 218. The second scribe line region 214 is arranged to form a second scribe line 220. The first scribe line 218 and the second scribe line 220 are arranged to protrude from the surface 104 to increase the wafer tension of the semiconductor structure 100.

According to some embodiments, the first scribe line 218 and the second scribe line 220 are formed by a semiconductor layer 222 of the MEMS wafer 202. The semiconductor layer 222 may be the substrate of the MEMS wafer 202. In the first scribe line region 210, the first scribe line 214 has a surface contacting with a first surface (i.e. 104) of an insulating line 224. A second surface of the insulating line 224 is contacted with a semiconductor layer 226. In the second scribe line region 214, the second scribe line 220 has a surface contacting with a first surface (i.e. 104) of a semiconductor line 228. A second surface of the semiconductor line 228 is contacted with the CMOS wafer 204 at the surface 206. The material of the insulating line 224 is the sacrificial material. For example, the material of the insulating line 224 may be silicon dioxide (SiO2), and this is not a limitation of the present disclosure. The material of the semiconductor line 228 is the structure material of the MEMS wafer 202. For example, the material of the semiconductor line 228 may be polycrystalline silicon, also called polysilicon or poly-Si, and this is not a limitation of the present disclosure. The materials of the scribe lines 218, 220, and the semiconductor layer 226 are the structure material of the MEMS wafer 202. For example, the material of the scribe lines 218, 220, and the semiconductor layer 226 may be silicon, and this is not a limitation of the present disclosure.

For illustration purpose, it is assumed that the first scribe line 218 and the second scribe line 220 have the similar line width W1. The line width of the insulating line 224 is W2. The thickness between the surface 206 and the surface 104 is H1. The thickness of the semiconductor layer 222 (i.e. the height between the surface 208 and the surface 104) is H2. The thickness of the CMOS wafer 204 is H3. The thickness of the die 106 is H4. The thickness of the semiconductor structure 100 is H5. According to some embodiments, in the first scribe line region 210, the line width W2 of the insulating line 224 is smaller than the line width W1 of the first scribe line 218. In the second scribe line region 214, the line width of the semiconductor line 228 is substantially equal to the line width W1 of the second scribe line 220. The line width W1 of the first scribe line 218 is arranged to be larger than the thickness H1. For example, the line width W1 of the first scribe line 218 may be at least two times larger than the thickness H1. For another example, the thickness H1 may be about 10 um, the line width W1 may be about 60 um, and the line width W2 may be about 20 um. According to some embodiments, the thickness H2 of the semiconductor layer 222 may be about 290 um. The thickness H3 of the CMOS wafer 204 may be about 240 um. The thickness H4 of the die 106 may be about 250 um. The thickness H5 of the semiconductor structure 100 may be about 540 um.

According to some embodiments, the insulating line 224 is arranged to make the first scribe line 218 to fix on the surface 104 while the semiconductor line 228 is arranged to make the second scribe line 220 to fix on the surface 104. When all of the scribe lines 102 are firmly fixed on the surface 104 of the semiconductor structure 100, the effective thickness H5 of the semiconductor structure 100 is increased. When the effective thickness H5 of the semiconductor structure 100 is increased, the wafer tension of the semiconductor structure 100 also increases such that the warpage or deformation of the semiconductor structure 100 can be reduced when the handling system handles the semiconductor structure 100 during transportation. In other words, by using the proposed scribe lines 102 to increase the effective thickness H5 of the semiconductor structure 100, the array of dies 106 can be designed to have relatively small thickness H4 (e.g. 250 um) while the handling system still can handle the semiconductor structure 100 without being delaminated.

Figure 3:
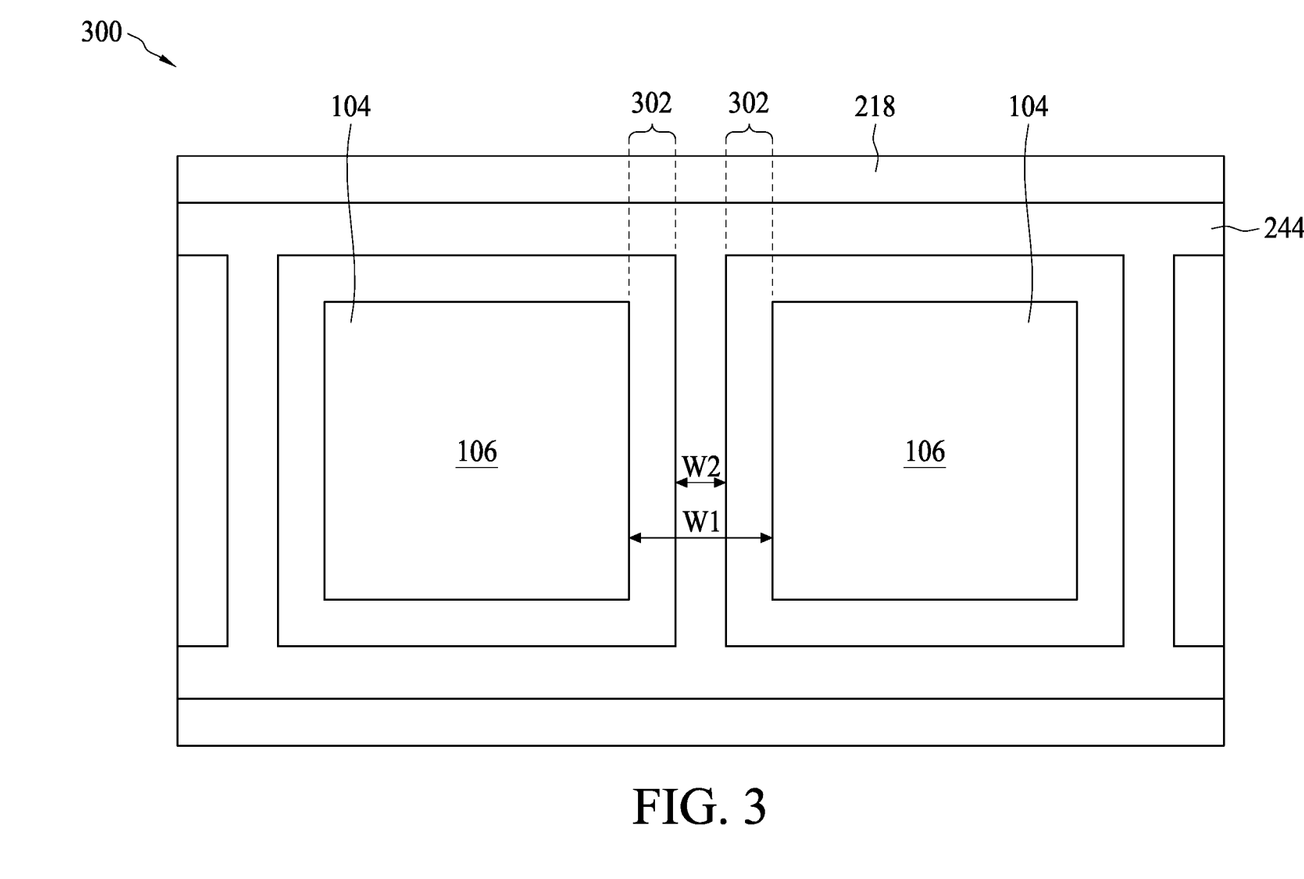
FIG. 3 is a diagram illustrating a top view of a portion of the wafer level semiconductor structure of FIG. 1 according to some embodiments.

FIG. 3 is a diagram illustrating a top view of a portion 300 of the semiconductor structure 100 according to some embodiments. The portion 300 only shows the area with the structure corresponding to the first scribe line region 210. The insulating line 224 is disposed on the surface 104. The first scribe line 218 is disposed on the insulating line 224. Thus, the insulating line 224 is arranged to attach the first scribe line 218 to the surface 104. The portion 302 of the first scribe line 218 is suspended over the surface 104. The dies are surrounded by the insulating line 224 and the first scribe line 218. The line width of the insulating line 224 is W2. The line width of the first scribe line 218 is W1.

Figure 4:
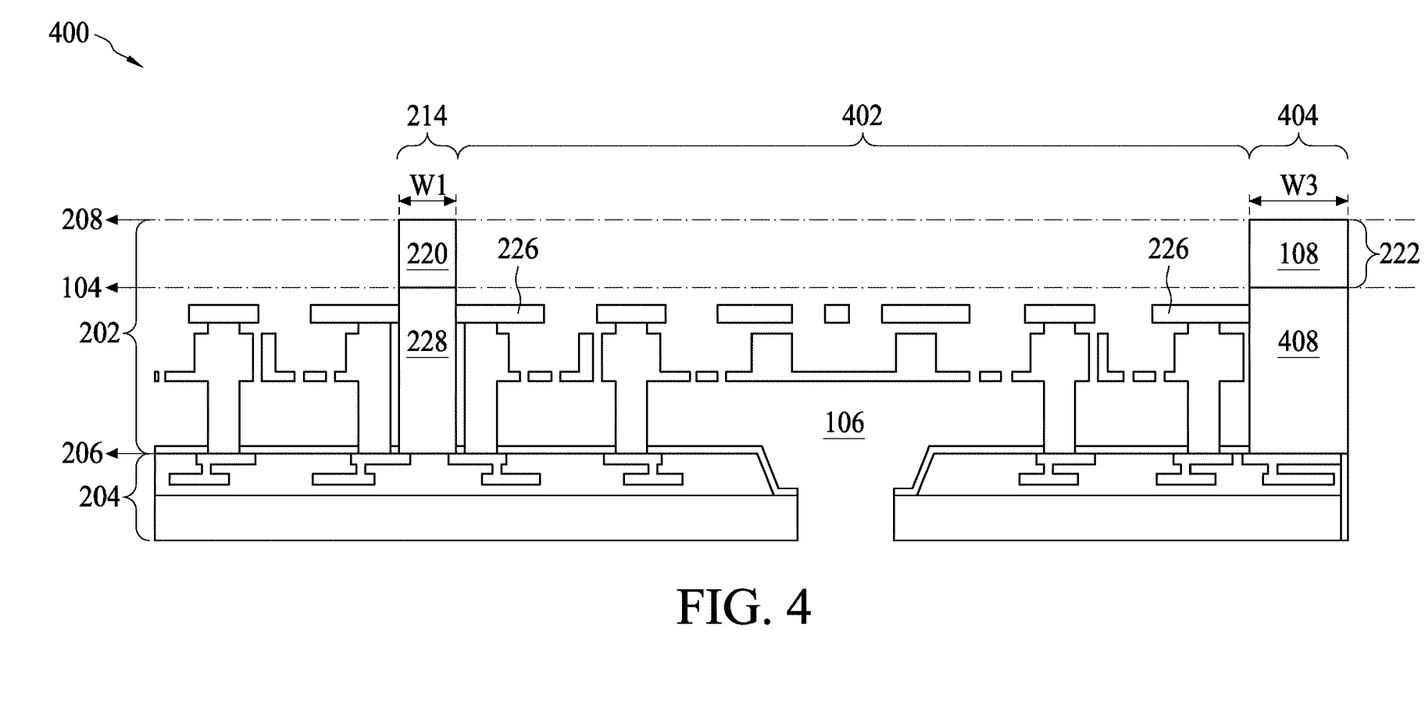
FIG. 4 is a diagram illustrating a cross-sectional view of a portion of the wafer level semiconductor structure taken along the line B-B' shown in FIG. 1 according to some embodiments.

According to some embodiments, the wafer edge line 108 is disposed on a semiconductor line in the wafer edge region of the MEMS wafer 202 as shown in FIG. 4. FIG. 4 is a diagram illustrating a cross-sectional view of a portion 400 of the semiconductor structure 100 taken along the line B-B' shown in FIG. 1 according to some embodiments. FIG. 4 merely shows the portion 400 of the semiconductor structure 100, and this is not a limitation of the present disclosure. For illustration purpose, some numerals in FIG. 2 are also labelled in FIG. 4. According to some embodiments, the portion 400 at least comprises three regions, in which the first region is second scribe line region 214 as shown in FIG. 2, the second region is a die region 402, and the third region is a wafer edge region 404. The die region 402 is disposed between the second scribe line region 214 and the wafer edge region 404. For illustration purpose, the structure of the second scribe line region 214 in FIG. 4 is not a limitation of the present disclosure. The structure of the second scribe line region 214 may be the structure of the first scribe line region 210 in FIG. 4.

According to the portion 400 as shown in FIG. 4, a die 106 is formed in the die region 402. The second scribe line region 214 and the wafer edge region 404 are to be cut by a cutting tool to singulate the die 106. The second scribe line region 214 is arranged to form the second scribe line 220. The wafer edge region 404 is arranged to form the wafer edge line 108. The second scribe line 220 and the wafer edge line 108 are arranged to protrude from the surface 104 to increase the wafer tension of the semiconductor structure 100.

According to some embodiments, the wafer edge line 404 is formed by the semiconductor layer 222 of the MEMS wafer 202. In the wafer edge region 404, the wafer edge line 108 has a surface contacting with a first surface (i.e. 104) of a semiconductor line 408. A second surface of the semiconductor line 408 is contacted with the CMOS wafer 204 at the surface 206. The material of the semiconductor line 408 may be polycrystalline silicon. The material of the wafer edge line 108 may be silicon.

For illustration purpose, it is assumed that the line width of the wafer edge line 108 is W3. According to some embodiments, the line width of the semiconductor line 408 is substantially equal to the line width of the wafer edge line 108, i.e. W3. The line width W3 of the wafer edge line 108 is larger than the line width W1 of the second scribe line 220. For example, the line width W1 may be about 60 um, and the line width W3 may be about 5 mm.

According to some embodiments, the semiconductor line 408 is arranged to make the wafer edge line 108 to fix on the surface 104. The wafer edge line 108 surrounds the plurality of scribe lines 102, and the two ends of each of the scribe lines 102 contact with the inner side of the wafer edge line 108 as shown in FIG. 1.

Accordingly, when all of the scribe lines 102 and the wafer edge line 108 are firmly fixed on the surface 104 of the semiconductor structure 100, not only the effective thickness H5 of the semiconductor structure 100 is increased, the wafer tension of the semiconductor structure 100 is further increased such that the warpage or deformation of the semiconductor structure 100 can be reduced when the handling system handles the semiconductor structure 100 during transportation. In other words, by using the proposed scribe lines 102 and the wafer edge line 108 to increase the effective thickness H5 and the wafer tension of the semiconductor structure 100, the array of dies 106 can be designed to have relatively small thickness H4 (e.g. 250 um) while the handling system still can handle the semiconductor structure 100 without being delaminated.

Figure 5:
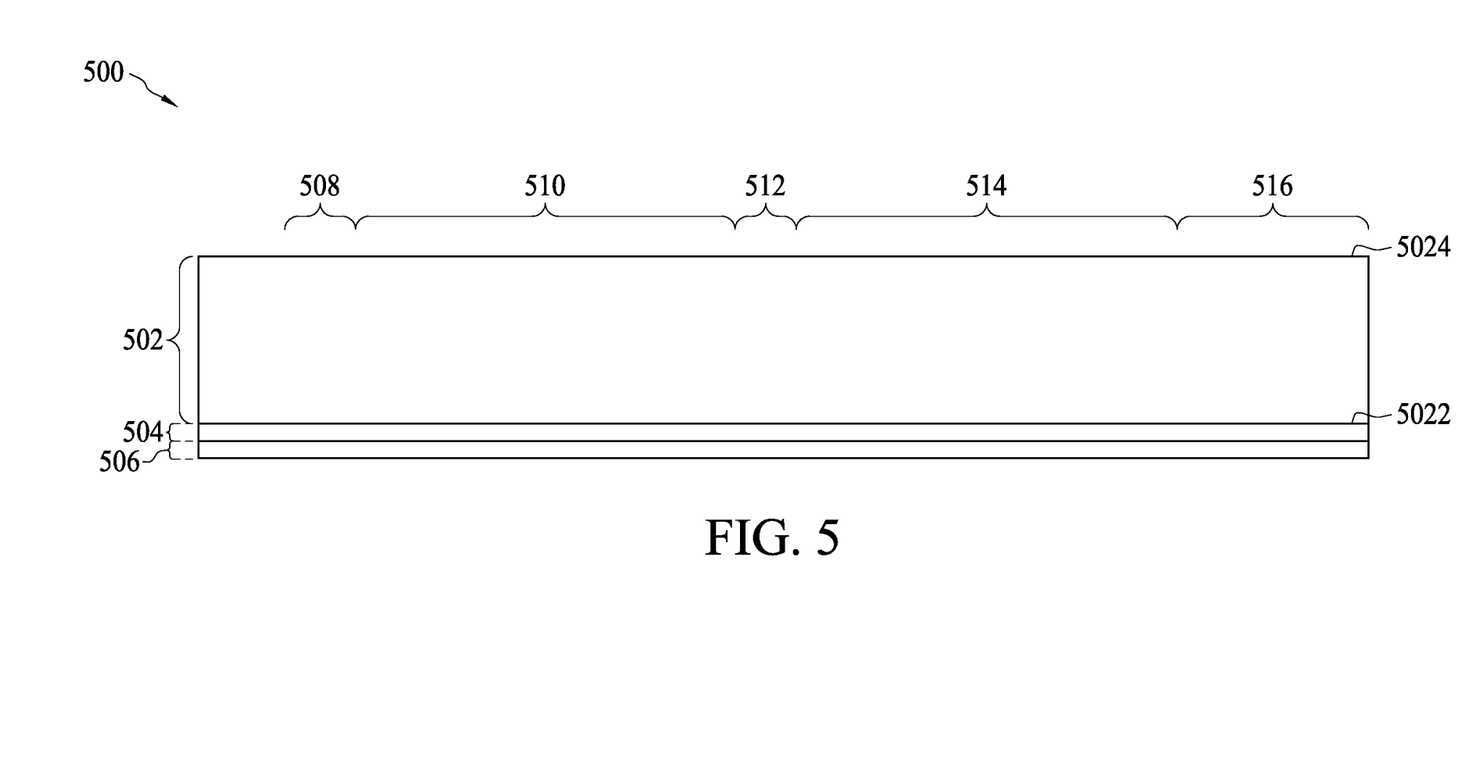
FIG. 5 to FIG. 13 are cross-sectional views of a CMOS-MEMS wafer fabricated at various stages, in accordance with some embodiments of the present disclosure.

For brevity, the formation of the portions 200 and 300 of the semiconductor structure 100 are described with reference to FIG. 5 to FIG. 13 in detail below. This is not a limitation of the present disclosure. FIG. 5 to FIG. 13 are cross-sectional views of a MEMS-CMOS wafer fabricated at various stages, in accordance with some embodiments of the present disclosure. In FIG. 5, a MEMS wafer 500 is provided. The MEMS wafer 500 comprises a substrate 502, an oxide layer 504, and a semiconductor layer 506. The substrate 502 has a first surface 5022 and a second surface 5024 opposite to the first surface 5022. The oxide layer 504 is disposed on the first surface 5022 of the substrate 502. The semiconductor layer 506 is disposed on the oxide layer 504. In FIG. 5, a first scribe line region 508, a first die region 510, a second scribe line region 512, a second die region 514, and a wafer edge region 516 are defined in MEMS wafer 500.

Figure 6:
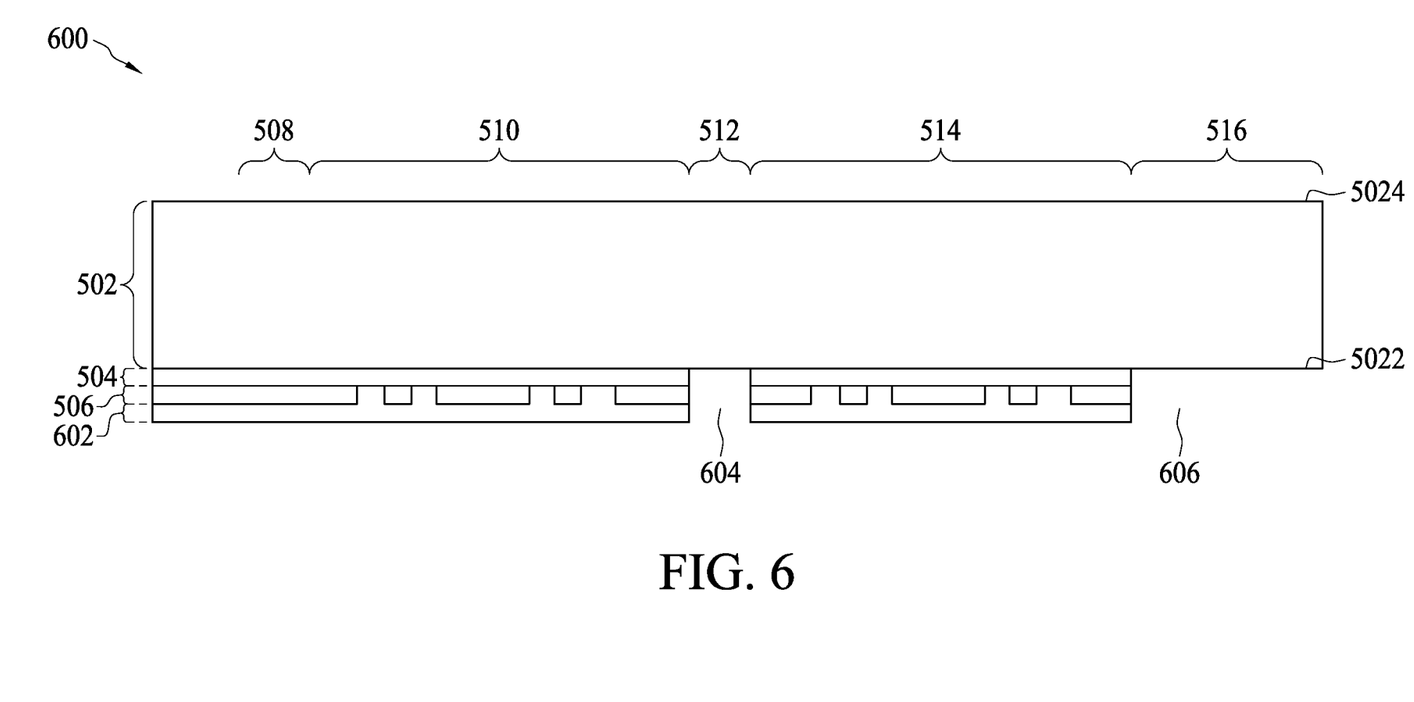

In FIG. 6, an etching MEMS wafer 600 is provided. According to some embodiments, the oxide layer 504 and the semiconductor layer 506 in the first scribe line region 508 are not etched. The oxide layer 504 and the semiconductor layer 506 in the second scribe line region 512 are etched. The oxide layer 504 and the semiconductor layer 506 in the wafer edge region 516 are etched. The oxide layer 504 in the first die region 510 and the second die region 514 are not etched. The semiconductor layer 506 in the first die region 510 and the second die region 514 are etched according to a pattern. The pattern corresponds to the top surfaces of the individual dies. After the etching process, an oxide layer 602 is disposed over the oxide layer 504 and the semiconductor layer 506. However, the second scribe line region 512 and the wafer edge region 516 are not disposed by the oxide layer 602. In other words, in the second scribe line region 512 and the wafer edge region 516, a scribe line trench 604 and a wafer edge line trench 606 are formed to expose the first surface 5022 of the substrate 502.

Figure 7:
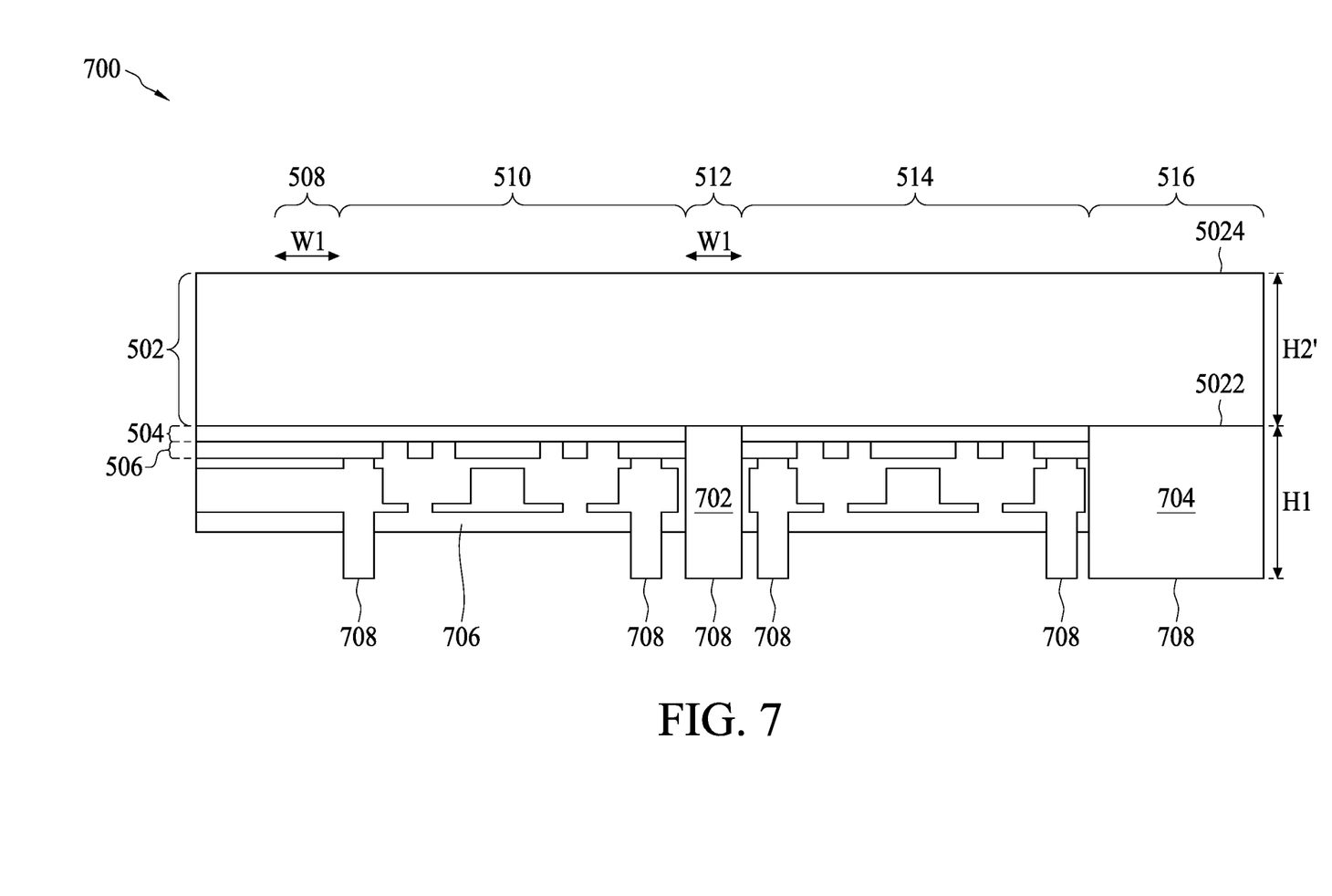

In FIG. 7, a structured MEMS wafer 700 is provided. According to some embodiments, the scribe line trench 604 and the wafer edge line trench 606 are disposed with a semiconductor material to form a scribe line contact 702 and a wafer edge line contact 704, respectively. The scribe line contact 702 has a first end contacted with the first surface 5022 of the substrate 502 and a second end configured to be a contacting surface 708 of the structured MEMS wafer 700. The wafer edge line contact 704 has a first end contacted with the first surface 5022 of the substrate 502 and a second end configured to be the contacting surface 708 of the structured MEMS wafer 700. The semiconductor material may be polycrystalline silicon. In the first die region 510 and the second die region 514, the predetermined mechanical structures of the dies are formed over the semiconductor layer 506 by using the semiconductor material. In the first scribe line region 508, the oxide layer 706 is formed over the semiconductor layer 506. The oxide layer 706 is also filled in the spaces among the mechanical structures of the dies. The contacting surface 708 of the structured MEMS wafer 700 may protrude from the oxide layer 706. In addition, the heights of the scribe line contact 702 and a wafer edge line contact 704 are H1. The thickness of the substrate 502 is H2'. The width of the first scribe line region 508 is W1. According to some embodiments, the width W1 is larger than the height H1. For example, the width W1 may be two times larger than the height H1. According to some embodiments, the height H1 may be about 10 um, and the thickness H2' may be about 600 um.

Figure 8:
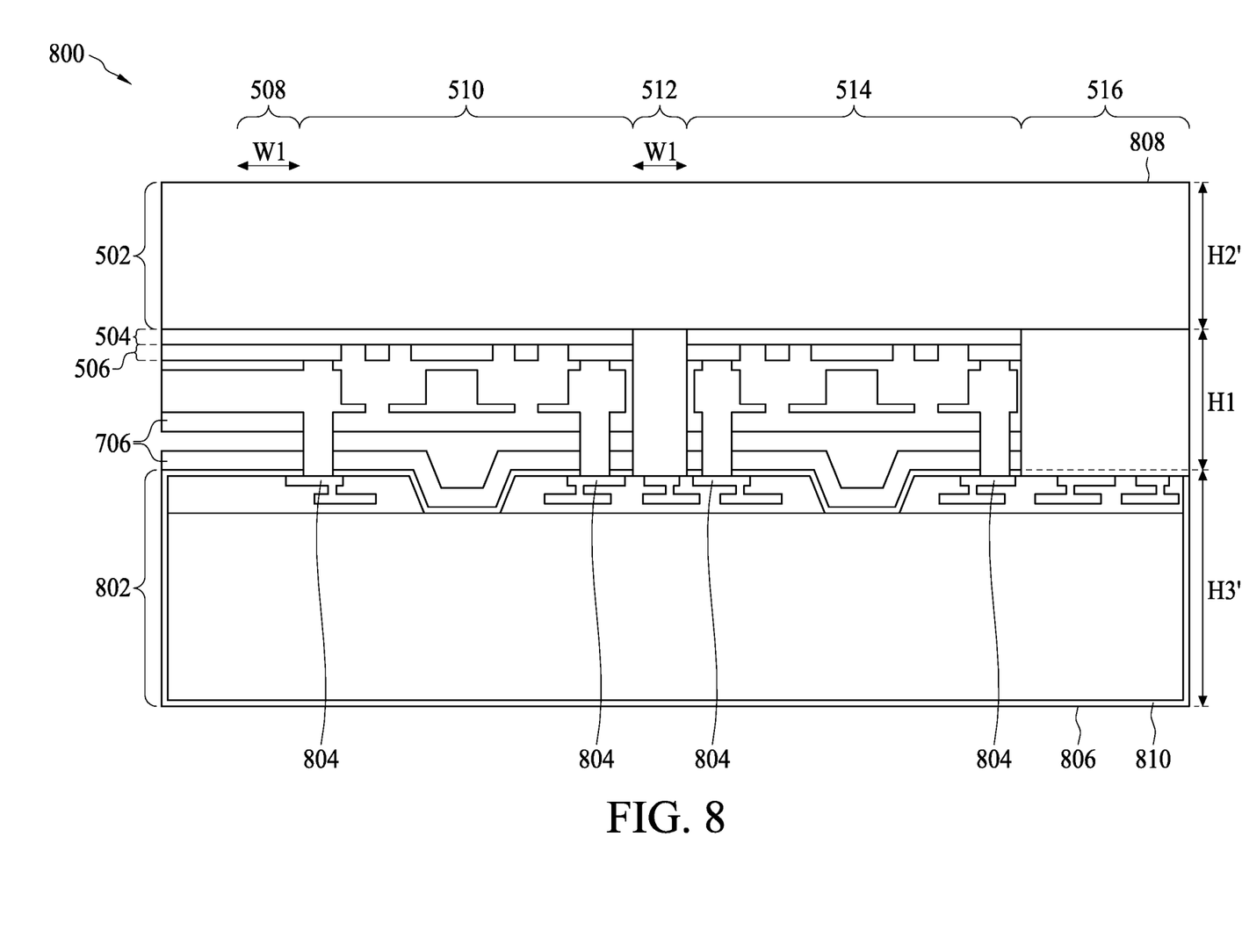

In FIG. 8, a bonding MEMS-CMOS wafer 800 is provided. According to some embodiments, a CMOS wafer 802 having integrated circuits formed therein is bonded to the contacting surface 708 of the structured MEMS wafer 700. The contacting surface 708 of the structured MEMS wafer 700 is eutectic boned to the predetermined interconnections 804 of the CMOS wafer 802 such that the structured MEMS wafer 700 may be electrically connected to the CMOS wafer 802. The bonding MEMS-CMOS wafer 800 has a bottom surface 806 and a top surface 808. A release barrier 810 is disposed over the CMOS wafer 802. The thickness of the CMOS wafer 802 is H3'. According to some embodiments, the thickness H3' may be about 725 um. Accordingly, the total thickness of the bonding MEMS-CMOS wafer 800 in FIG. 8 may be about 1335 um.

Figure 9:
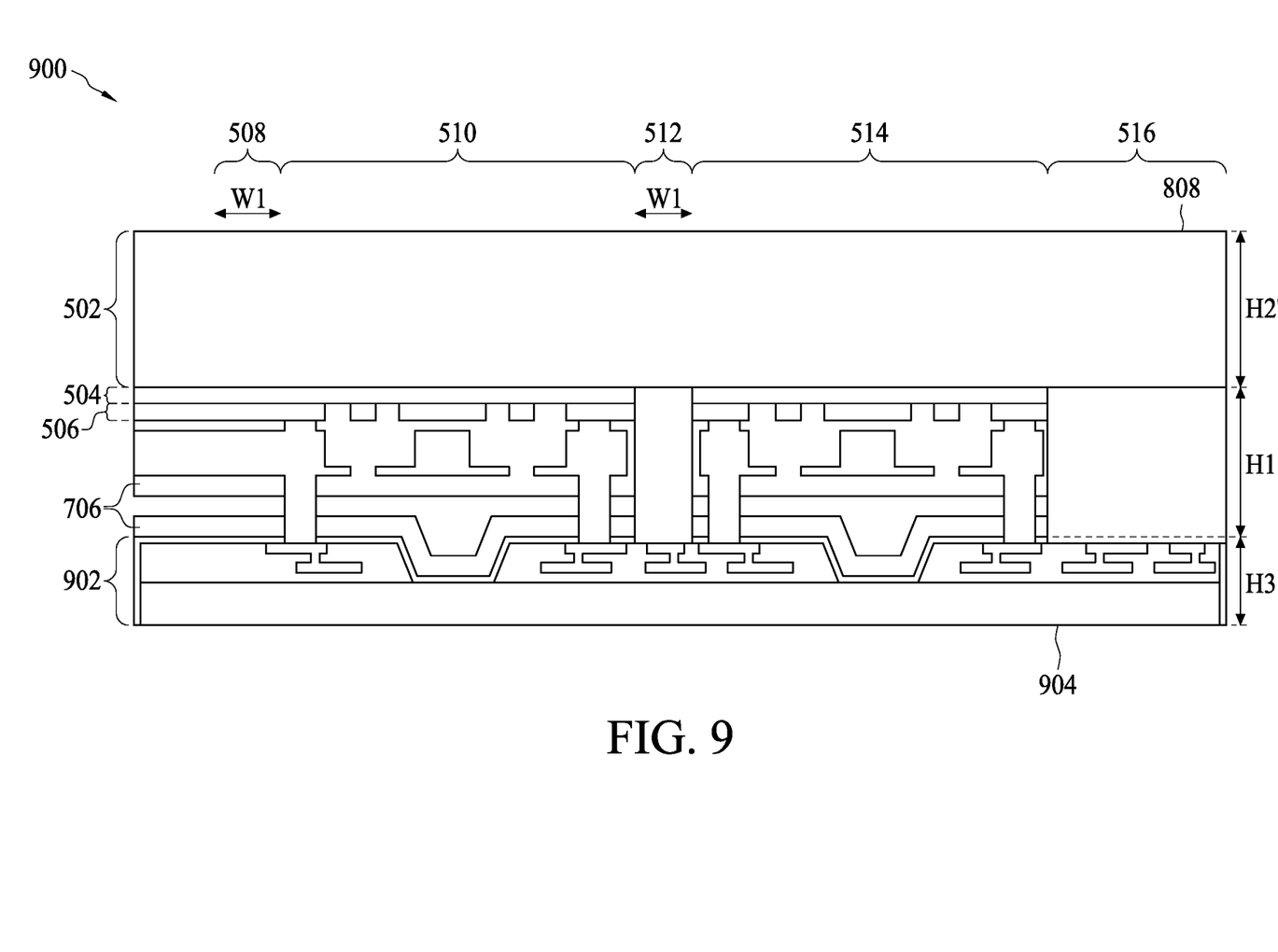

In FIG. 9, a first thinned down MEMS-CMOS wafer 900 is provided. According to some embodiments, a thinning process is performed upon the bottom surface 806 at the CMOS wafer 802 to form a thinned down CMOS wafer 902 with a bottom surface 904. The thickness of the thinned down CMOS wafer 902 is H3. The thickness H3 of the thinned down CMOS wafer 902 may be about 240 um. Accordingly, the total thickness of the first thinned down MEMS-CMOS wafer 900 in FIG. 9 may be about 850 um.

Figure 10:
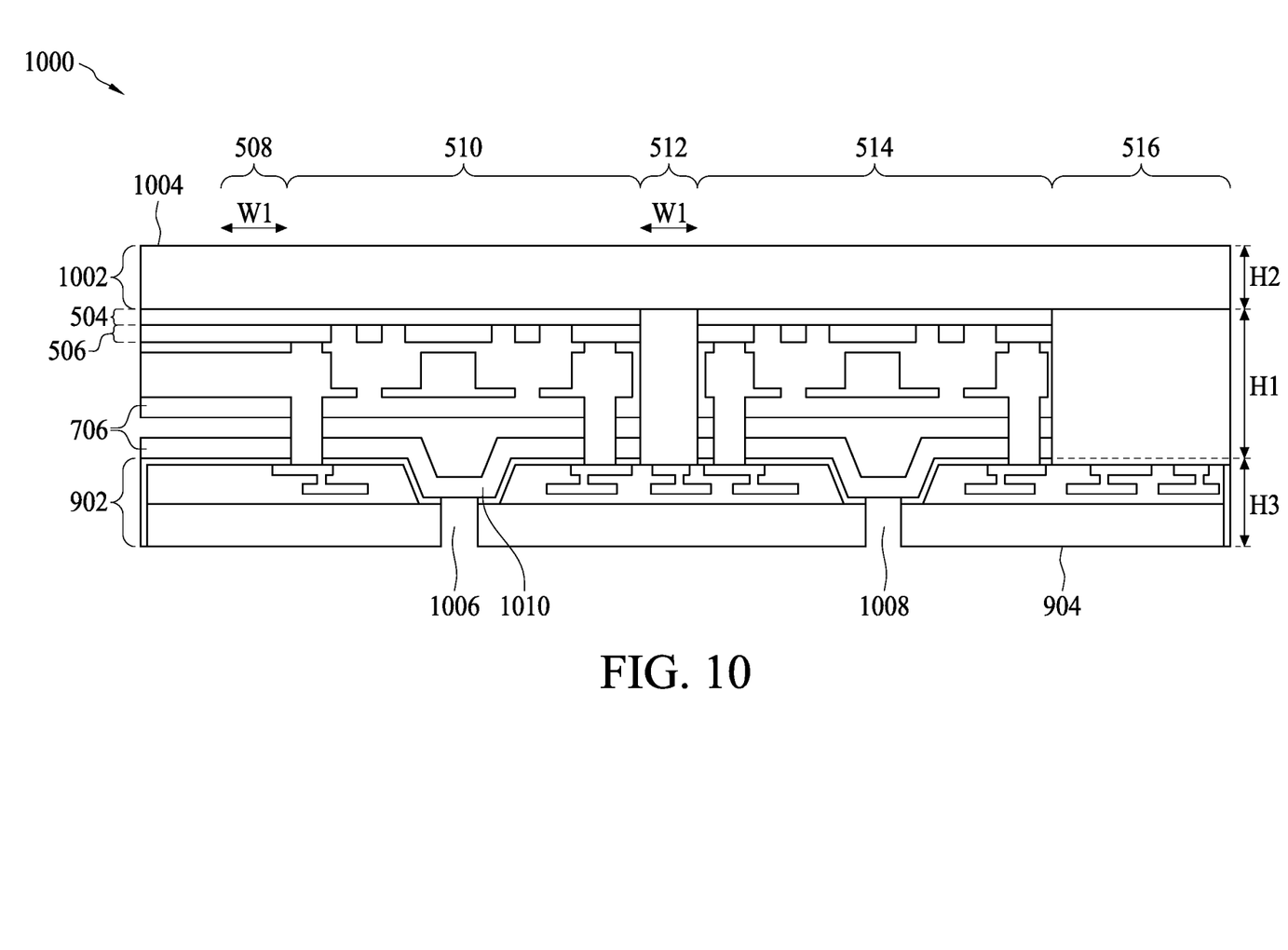

In FIG. 10, a second thinned down MEMS-CMOS wafer 1000 is provided. According to some embodiments, a thinning process is performed upon the top surface 808 at the substrate 502 to form a thinned down substrate 1002 with a thinned down surface 1004. The thickness of the thinned down substrate 1002 is H2. The thickness H2 of the thinned down substrate 1002 may be about 290 um. Accordingly, the total thickness of the second thinned down MEMS-CMOS wafer 1000 in FIG. 10 may be about 540 um. According to some embodiments, the bottom surface 904 of the thinned down CMOS wafer 902 corresponding to the first die region 510 and the second die region 514 may be etched to have a first trench 1006 and a second trench 1008 respectively. The first trench 1006 and the second trench 1008 are arranged to expose the oxide layer 1010 in the thinned down CMOS wafer 902.

Figure 11:
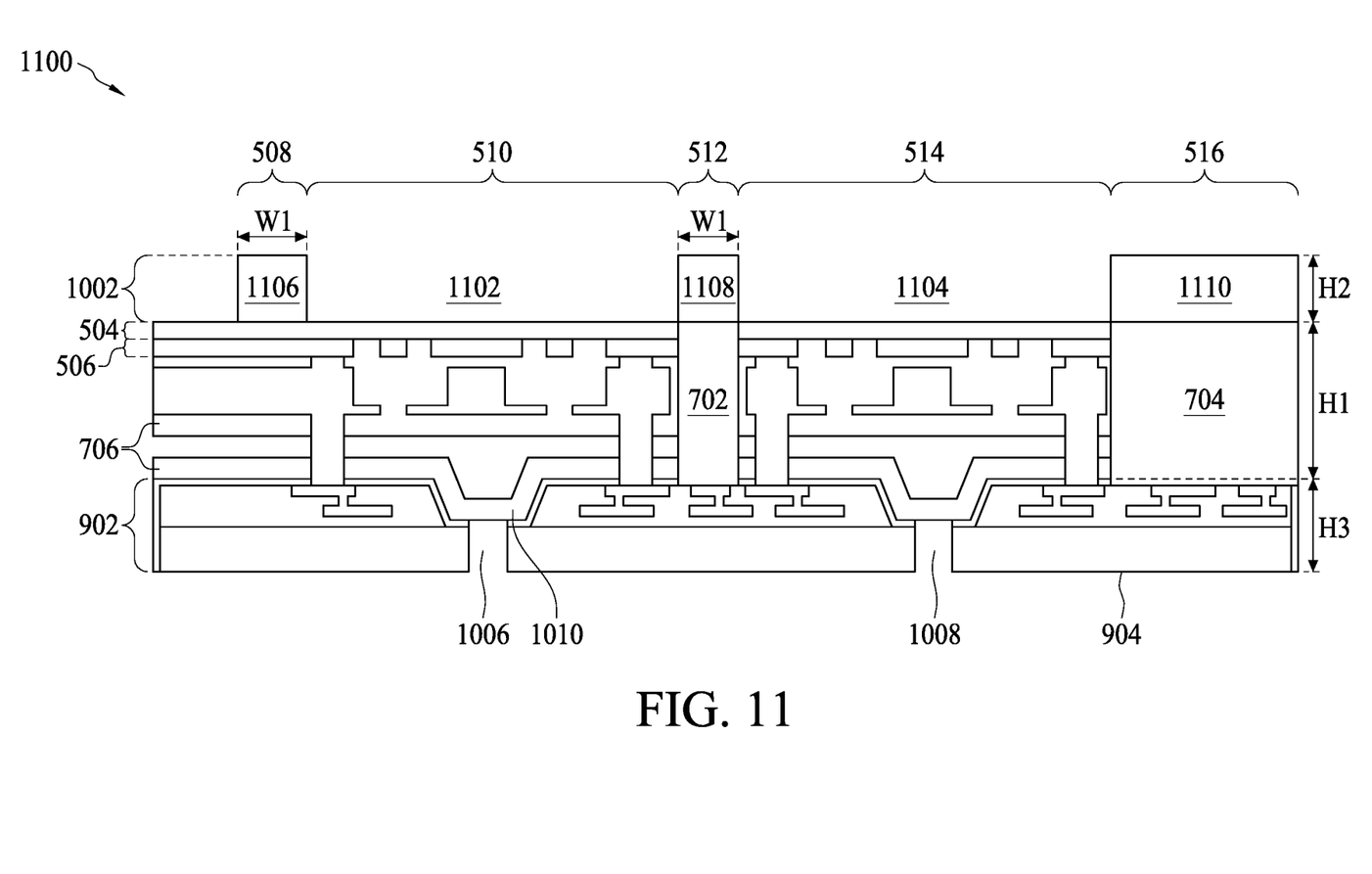

In FIG. 11, an etched MEMS-CMOS wafer 1100 is provided. According to some embodiments, an etching process is performed upon the thinned down surface 1004 at the thinned down substrate 1002. The etching process is arranged to etch the thinned down substrate 1002 corresponding to the first die region 510 and the second die region 514 to form a first trench 1102 and a second trench 1104, respectively. According to some embodiments, the first scribe line region 508, the second scribe line region 512, and the wafer edge region 516 are masked by a photoresist layer, and the first die region 510 and the second die region 514 are not masked by the photoresist layer. Then, the thinned down substrate 1002 corresponding to the masked region (i.e. the first scribe line region 508, the second scribe line region 512, and the wafer edge region 516) are not etched, and the thinned down substrate 1002 corresponding to the unmasked region (i.e. the first die region 510 and the second die region 514) are etched. After the etching process, the first trench 1102 and the second trench 1104 expose the oxide layer 504 in the second thinned down MEMS-CMOS wafer 1000. The thinned down substrate 1002 corresponding to the first scribe line region 508, the second scribe line region 512, and the wafer edge region 516 form three etching substrates 1106, 1108, 1110 respectively. Accordingly, the etching substrate 1106 contacts the oxide layer 504, the etching substrate 1108 contacts the scribe line contact 702, and the etching substrate 1110 contacts the wafer edge line contact 704. According to some embodiments, the widths of the etching substrates 1106, 1108 are W1, the width of the etching substrate 1110 is W3, and the thickness of the oxide layer in the etched MEMS-CMOS wafer 1100 is H1. The width W1 of the etching substrate 1106 is at least two times larger than the thickness H1 of the oxide layer in the etched MEMS-CMOS wafer 1100. For example, the thickness H1 may be about 10 um, the width W1 may be about 60 um, and the width W3 may be about 5 mm.

Figure 12:
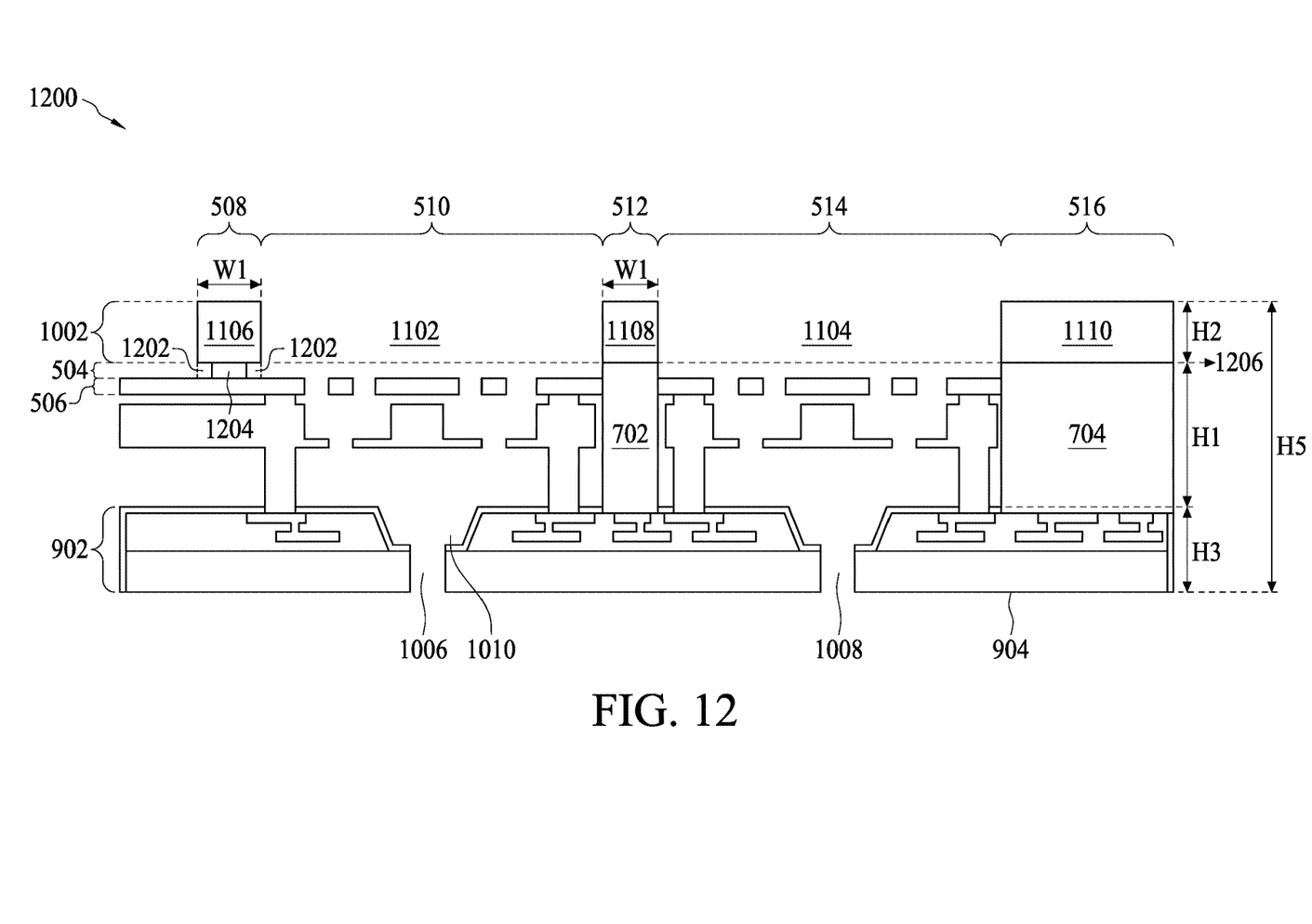

In FIG. 12, a MEMS-CMOS wafer 1200 is provided. According to some embodiments, an etching process is performed upon the etched MEMS-CMOS wafer 1100 for removing the oxide layers 504, 706, 1010 in the etched MEMS-CMOS wafer 1100. According to some embodiments, the width W1 of the oxide layer 504 sandwiched between the etching substrate 1106 and the semiconductor layer 506 is at least two times larger than the thickness H1 of the oxide layer in the etched MEMS-CMOS wafer 1100. When the speed of etching performed upon the oxide layer (i.e. 706, 1100) in the etched MEMS-CMOS wafer 1100 is substantially equal to the speed of etching performed upon the oxide layer 504, a portion of the oxide layer 504 sandwiched between the etching substrate 1106 and the semiconductor layer 506 may remain when the oxide layer (i.e. 706, 1100) in the etched MEMS-CMOS wafer 1100 is etched. Accordingly, in the first scribe line region 508, the outer portion 1202 of oxide layer 504 sandwiched between the etching substrate 1106 and the semiconductor layer 506 is etched or released by the etching process, and the inner portion 1204 of the oxide layer 504 sandwiched between the etching substrate 1106 and the semiconductor layer 506 is not etched by the etching process. Therefore, the inner portion 1204 may be used to fix the etching substrate 1106 on the semiconductor layer 506. According to some embodiments, to firmly fix the etching substrate 1106 on the semiconductor layer 506 by the inner portion 1204, the width W1 of the oxide layer 504 sandwiched between the etching substrate 1106 and the semiconductor layer 506 may be three times larger than the thickness H1 of the oxide layer in the etched MEMS-CMOS wafer 1100. In the second scribe line region 512 and the wafer edge region 516, the etching process are stopped by the scribe line contact 702 and the wafer edge line contact 704, respectively. Accordingly, the etching substrates 1106, 1108, and 1110 protruding from the surface 1206 are formed. The etching substrates 1106 and 1108 may be regarded as the first scribe line 218 and the second scribe line 220 in FIG. 2, and the etching substrate 1110 may be regarded as the wafer edge line 108 in FIG. 3. As the etching substrates 1106, 1108, and 1110 increase the effective thickness H5 (e.g. 540 um) of the MEMS-CMOS wafer 1200, the wafer tension of the MEMS-CMOS wafer 1200 is increased such that the warpage or deformation of the MEMS-CMOS wafer 1200 can be alleviated when the handling system handles the MEMS-CMOS wafer 1200 during transportation.

Figure 13:
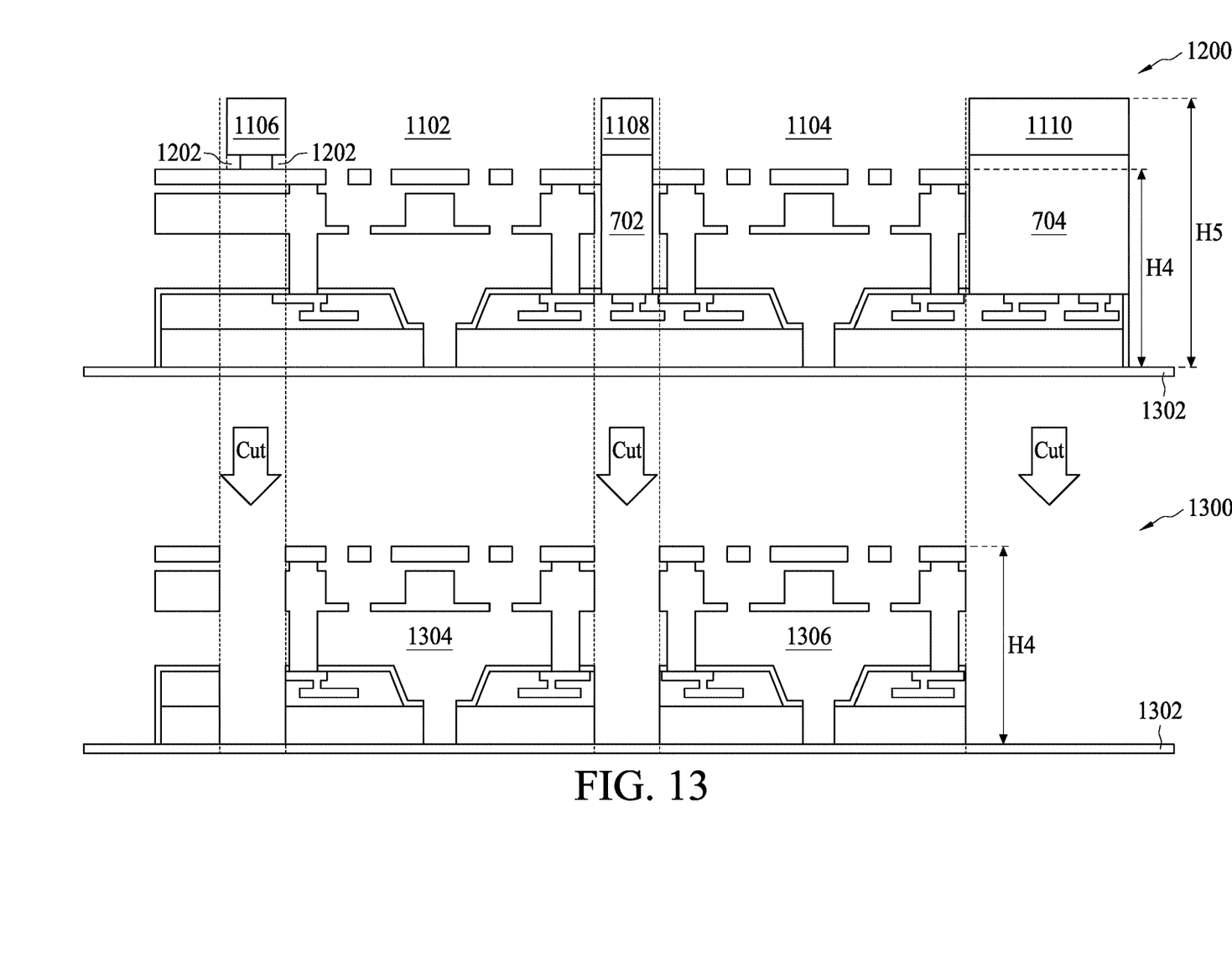

In FIG. 13, a dicing MEMS-CMOS wafer 1300 is provided. According to some embodiments, the MEMS-CMOS wafer 1200 is disposed on a dicing tape 1302. Then, the etching substrates 1106, 1108, and 1110 are cut by a cutting tool to singulate a first die 1304 and 1306. After dicing, the etching substrates 1106, 1108, and 1110 with the thickness H5 are removed, and the dies 1304 and 1306 with relatively small thickness H4 are singulated.

Therefore, by using the proposed method, the effective thickness H5 of the MEMS-CMOS wafer 1200 is increased, the array of dies 1304 and 1306 can be designed to have relatively small thickness H4 while the handling system still can handle the MEMS-CMOS wafer 1200 without being delaminated.

In some embodiments of the present disclosure, a method of fabricating a semiconductor structure is disclosed. The method comprises: providing a first wafer; providing a second wafer having a first surface and a second surface opposite to the first surface; contacting the first surface of the second wafer with the first wafer; and forming a plurality of scribe lines on the second surface of the second wafer, wherein the formation of the plurality of scribe lines includes removing portions of the second wafer from the second surface towards the first surface to form a third surface between the first surface and the second surface, and the plurality of scribe lines protrudes from the third surface of the second wafer.

In some embodiments of the present disclosure, a method of fabricating a semiconductor structure is disclosed. The method comprises: providing a first wafer; providing a second wafer having a first surface, a second surface opposite to the first surface, a first semiconductor layer, an oxide layer disposed over the first semiconductor layer and a second semiconductor layer disposed over the oxide layer, wherein the first semiconductor layer, the oxide layer and the second semiconductor layer are disposed between the first surface and the second surface; contacting the first surface of the second wafer with the first wafer; removing portions of the second semiconductor layer to form a plurality of scribe lines; and removing portions of the oxide layer exposed from the plurality of scribe lines.

In some embodiments of the present disclosure, a method of fabricating a semiconductor structure is disclosed. The method comprises: providing a first wafer; providing a second wafer having a first surface, a second surface opposite to the first surface, a first semiconductor layer, an oxide layer disposed over the first semiconductor layer and a second semiconductor layer disposed over the oxide layer, wherein the first semiconductor layer, the oxide layer and the second semiconductor layer are disposed between the first surface and the second surface; contacting the first surface of the second wafer with the first wafer; removing portions of the second semiconductor layer to form a plurality of scribe lines and a plurality of wafer edge lines; and cutting from the second surface of the second wafer towards the first wafer and along the plurality of scribe lines and the plurality of wafer edge lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:
   providing a first wafer having a first surface and a second surface opposite to the first surface;
   providing a second wafer;
   contacting the first surface of the first wafer with the second wafer; and
   forming a plurality of scribe lines on the second surface of the first wafer,
   wherein the formation of the plurality of scribe lines includes removing portions of the first wafer from the second surface towards the first surface to form a third surface between the first surface and the second surface, and the plurality of scribe lines protrudes from the third surface of the first wafer.

2. The method of claim 1, wherein the provision of the first wafer comprises:
- disposing an oxide layer between the first surface and the second surface;
- disposing a semiconductor layer on the oxide layer; and
- defining a scribe line region over the first wafer.

3. The method of claim 2, wherein the provision of the first wafer comprises:
- etching the semiconductor layer and the oxide layer corresponding to the scribe line region to form a scribe line trench; and
- disposing a semiconductor material in the scribe line trench to form a scribe line contact,
- wherein the scribe line contact has a first end and a second end, the first end contacts the first surface, and the second end corresponds to the third surface.

4. The method of claim 2, wherein the formation of the plurality of scribe lines comprises:
- thinning the first wafer from the second surface;
- masking the second surface to define a masked region and an unmasked region over the second surface according to the scribe line region;
- etching the unmasked region to expose the oxide layer corresponding to the unmasked region; and
- etching the oxide layer corresponding to the unmasked region to form the plurality of scribe lines.

5. The method of claim 4, wherein the etching of the oxide layer comprises:
- etching a portion of the oxide layer disposed under the semiconductor layer.

6. The method of claim 5, wherein a width of the oxide layer in the scribe line region is substantially less than a width of the semiconductor layer in the scribe line region.

7. The method of claim 1, further comprising:
- configuring the second surface of the first wafer to form a wafer edge line,
- wherein the wafer edge line protrudes from the third surface of the first wafer, and the wafer edge line surrounds the plurality of scribe lines.

8. The method of claim 7, wherein the provision of the first wafer comprises:
- disposing an oxide layer between the first surface and the second surface;
- disposing a semiconductor layer on the oxide layer; and
- defiling a wafer edge region on the first wafer.

9. The method of claim 8, wherein the provision of the first wafer comprises:
- etching the semiconductor layer and the oxide layer corresponding to the wafer edge region to form a wafer edge trench; and
- disposing a semiconductor material in the wafer edge trench to form a wafer edge contact,
- wherein the wafer edge contact has a first end and a second end, the first end contacts the first surface, and the second end corresponds to the third surface.

10. The method of claim 9, wherein the formation of the wafer edge line comprises:
- thinning the first wafer from the second surface;
- masking the second surface to define a masked region and an unmasked region over the second surface according to the wafer edge region;
- etching the unmasked region to expose the oxide layer corresponding to the unmasked region; and
- etching the oxide layer corresponding to the unmasked region to form the wafer edge line.

11. A method of fabricating a semiconductor structure, comprising:
- providing a first wafer having a first surface, a second surface opposite to the first surface, a first semiconductor layer, an oxide layer disposed over the first semiconductor leer and a second semiconductor layer disposed over the oxide layer, wherein the first semiconductor layer, the oxide layer and the second semiconductor layer are disposed between the first surface and the second surface;
- providing a second wafer;
- contacting the first surface of the first wafer with the second wafer;
- removing portions of the second semiconductor layer to form a plurality of scribe lines; and
- removing portions of the oxide layer exposed from the plurality of scribe lines.

12. The method of claim 11, wherein a width of one of the plurality of scribe lines is substantially greater than a width of the oxide layer after the removal of the portions of the oxide layer.

13. The method of claim 11, further comprising forming a scribe line contact extending within the first wafer.

14. The method of claim 13, wherein the scribe line contact is in contact with one of the plurality of scribe lines.

15. The method of claim 13, further comprising defining a plurality of scribe line regions and a plurality of die regions over the second semiconductor layer, wherein the scribe line contact is disposed within one of the plurality of scribe line regions.

16. The method of claim 15, further comprising masking the plurality of scribe line regions by a photoresist layer and exposing the plurality of die regions prior to the removal of the portions of the second semiconductor layer.

17. The method of claim 11, wherein the contact of the first surface of the second wafer with the first wafer includes bonding the second wafer with the first wafer.

18. A method of fabricating a semiconductor structure, comprising:
- providing a first wafer having a first surface, a second surface opposite to the first surface, a first semiconductor laver, an oxide layer disposed over the first semiconductor layer and a second semiconductor layer disposed over the oxide layer, wherein the first semiconductor layer, the oxide layer and the second semiconductor layer are disposed between the first surface and the second surface;
- providing a second wafer;
- contacting the first surface of the first wafer with the second wafer;
- removing portions of the second semiconductor layer to form a plurality of scribe lines and a plurality of wafer edge lines; and
- cutting from the second surface of the first wafer towards the second wafer and along the plurality of scribe lines and the plurality of wafer edge lines.

19. The method of claim 18, wherein the cutting includes removing the plurality of scribe lines and the plurality of wafer edge lines.

20. The method of claim 18, wherein the cutting includes removing the second wafer disposed under the plurality of wafer edge lines.

* * * * *